United States Patent
Cox et al.

(10) Patent No.: US 9,867,238 B2
(45) Date of Patent: Jan. 9, 2018

(54) APPARATUS FOR TREATING AN EXHAUST GAS IN A FORELINE

(71) Applicant: APPLIED MATERIALS, INC., Santa Clara, CA (US)

(72) Inventors: Michael S. Cox, Gilroy, CA (US); Colin John Dickinson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1300 days.

(21) Appl. No.: 13/860,572

(22) Filed: Apr. 11, 2013

(65) Prior Publication Data

US 2013/0284724 A1    Oct. 31, 2013

Related U.S. Application Data

(60) Provisional application No. 61/638,822, filed on Apr. 26, 2012.

(51) Int. Cl.
*H05B 6/36* (2006.01)
*H01J 37/32* (2006.01)
(Continued)

(52) U.S. Cl.
CPC .......... *H05B 6/36* (2013.01); *H01J 37/32834* (2013.01); *H01J 37/32844* (2013.01);
(Continued)

(58) Field of Classification Search
CPC combination set(s) only.
See application file for complete search history.

(56) References Cited

U.S. PATENT DOCUMENTS 3,958,883 A * 5/1976 Turner ..................... H05H 1/46
219/121.36
4,795,880 A * 1/1989 Hayes ................. C23C 16/4405
118/723 I
(Continued)

FOREIGN PATENT DOCUMENTS

JP    2002-210330 A    7/2002
JP    2005-087938 A    4/2005

OTHER PUBLICATIONS

Search Report from the State Intellectual Property Office of The People's Republic of China dated Feb. 5, 2016 for received from Chinese Patent Application No. 2013800211256.
(Continued)

*Primary Examiner* — Anne M Antonucci
*Assistant Examiner* — Renee LaRose
(74) *Attorney, Agent, or Firm* — Moser Taboada; Alan Taboada

(57) ABSTRACT

In some embodiments an apparatus for treating an exhaust gas in a foreline of a substrate processing system may include a dielectric tube configured to be coupled to the foreline of the substrate processing system to allow a flow of exhaust gases from the foreline through the dielectric tube; an RF coil wound about an outer surface of the dielectric tube, the RF coil having a first end to provide an RF input to the RF coil, the first end of the RF coil disposed proximate a first end of the dielectric tube and a second end disposed proximate a second end of the dielectric tube; a tap coupled to the RF coil to provide an RF return path, the tap disposed between the first end of the dielectric tube and a central portion of the dielectric tube.

13 Claims, 1 Drawing Sheet

(51) Int. Cl.
   *H05H 1/46* (2006.01)
   *F01N 3/027* (2006.01)

(52) U.S. Cl.
   CPC .............. *H05H 1/46* (2013.01); *F01N 3/0275* (2013.01); *F01N 2240/28* (2013.01); *H05H 2001/4667* (2013.01); *H05H 2245/1215* (2013.01); *Y02C 20/30* (2013.01)

(56) References Cited

U.S. PATENT DOCUMENTS

| | | | |
|---|---|---|---|
| 6,017,221 A | 1/2000 | Flamm | |
| 6,291,938 B1 | 9/2001 | Jewett et al. | |
| 6,508,198 B1 * | 1/2003 | Hoffman | H01J 37/32183 118/723 I |
| 6,689,930 B1 | 2/2004 | Pang et al. | |
| 6,888,040 B1 * | 5/2005 | Shufflebotham | B01D 53/70 423/240 R |
| 6,905,663 B1 | 6/2005 | Arno | |
| 2001/0016674 A1 | 8/2001 | Pang et al. | |
| 2002/0125223 A1 * | 9/2002 | Johnson | H01J 37/321 219/121.43 |
| 2004/0131513 A1 * | 7/2004 | Lazarovich | B01D 53/326 422/186.04 |
| 2005/0093460 A1 * | 5/2005 | Kim | H01J 37/321 315/111.21 |
| 2005/0103623 A1 | 5/2005 | Tolmachev et al. | |
| 2005/0194355 A1 | 9/2005 | Lohokare et al. | |
| 2007/0051388 A1 | 3/2007 | Sorensen | |
| 2008/0057726 A1 | 3/2008 | Kim | |
| 2009/0022905 A1 | 1/2009 | Kudela et al. | |
| 2009/0255222 A1 * | 10/2009 | Cortez | B01J 19/088 55/295 |
| 2010/0055807 A1 | 3/2010 | Srivastava et al. | |
| 2011/0135552 A1 | 6/2011 | Dickinson et al. | |

OTHER PUBLICATIONS

International Search Report and Written Opinion dated Jul. 24, 2013 for PCT Application No. PCT/US2013/036590.
Search Report for Taiwan Invention Patent Application No. 102113786 dated Aug. 17, 2016.

* cited by examiner

APPARATUS FOR TREATING AN EXHAUST GAS IN A FORELINE

CROSS-REFERENCE TO RELATED APPLICATIONS

This application claims benefit of U.S. provisional patent application Ser. No. 61/638,822, filed Apr. 26, 2012, which is herein incorporated by reference in its entirety.

FIELD

Embodiments of the present invention generally relate to substrate processing equipment.

BACKGROUND

Some exhaust treatment systems utilize radio frequency (RF) energy provided to a central portion of an RF coil disposed about a dielectric tube to facilitate ignition of exhaust gases flowing through the dielectric tube to form a plasma. However, the inventors have observed that portions of the inner wall of the tube may undesirably become eroded over time.

Therefore, the inventors have provided an improved exhaust treatment system for treating a process exhaust gas in a foreline

SUMMARY

Apparatus for treating an exhaust gas in a foreline of a substrate processing system is provided herein. In some embodiments an apparatus for treating an exhaust gas in a foreline of a substrate processing system may include a dielectric tube configured to be coupled to the foreline of the substrate processing system to allow a flow of exhaust gases from the foreline through the dielectric tube; an RF coil wound about an outer surface of the dielectric tube, the RF coil having a first end to provide an RF input to the RF coil, the first end of the RF coil disposed proximate a first end of the dielectric tube and a second end disposed proximate a second end of the dielectric tube; a tap coupled to the RF coil to provide an RF return path, the tap disposed between the first end of the dielectric tube and a central portion of the dielectric tube.

In some embodiments, a substrate processing system may include a process chamber, a foreline coupled to the process chamber to allow a flow of exhaust gases from the process chamber; a vacuum pump coupled to the foreline to evacuate exhaust gases from the process chamber through the foreline; and a dielectric tube coupled to the foreline and in line with the foreline and disposed between the vacuum pump and process chamber to allow a flow of exhaust gases from the foreline through the dielectric tube, the dielectric tube having an RF coil wound about an outer surface of the dielectric tube, the RF coil having a first end to provide an RF input to the RF coil, the first end disposed proximate a first end of the dielectric tube and a second end disposed proximate a second end of the dielectric tube and a tap coupled to the RF coil to provide an RF return path, the tap disposed between the first end of the dielectric tube and a middle of the dielectric tube.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
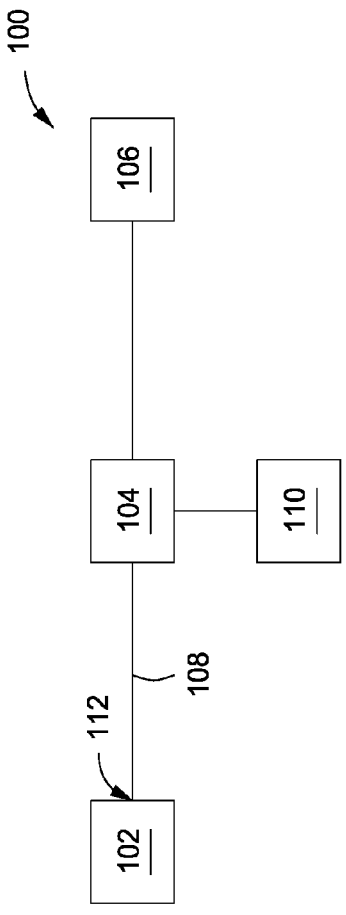
FIG. 1 is a processing system suitable for use with an apparatus for treating exhaust gas in a foreline in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for treating exhaust gas in a foreline are provided herein. Embodiments of the inventive apparatus may advantageously provide a reduction, deceleration or elimination of erosion of components (e.g., a dielectric or ceramic tube) as compared to conventionally utilized plasma driven gas treatment systems.

FIG. 1 is a schematic view of a processing system 100 suitable for use with an apparatus for treating exhaust gas in a foreline in accordance with some embodiments of the present invention. The processing system 100 generally comprises a process chamber 102, a foreline 108 coupled to the process chamber 102, and apparatus for treating exhaust gas 104 coupled to the foreline 108.

The process chamber 102 may be any process chamber suitable to perform a process on a substrate. In some embodiments, the process chamber 102 may be part of a processing tool, for example a cluster tool, in line processing tool or the like. Non-limiting examples of such tools include substrate processing systems such as those used in semiconductor, display, solar, or light emitting diode (LED) manufacturing processes.

The foreline 108 is coupled to an exhaust port 112 of the process chamber 102 and facilitates the removal of exhaust gases from the process chamber 102. The exhaust gases may be any gases, for example such as process gases or byproduct gases that require removal from the process chamber 102. The foreline 108 may be coupled to a vacuum pump 106 or other suitable pumping apparatus to pump the exhaust gases from the process chamber 102 to appropriate downstream exhaust handling equipment (such as abatement equipment or the like). In some embodiments, the vacuum pump 106 may be a roughing pump or backing pump, such as a dry mechanical pump, or the like. In some embodiments, the vacuum pump 106 may have a variable pumping capacity which can be set at a desired level, for example, to control or provide additional control of pressure in the foreline 108.

The apparatus for treating exhaust gas 104 is disposed in-line with the foreline 108 and facilitates treatment or abatement of the exhaust gases from the process chamber 102. A power source 110, such as an RF power source, is coupled to the apparatus for treating exhaust gas 104 to provide power to the apparatus for treating exhaust gas 104 to facilitate the plasma treatment of the exhaust gases. The power source 110 provides RF energy at a desired frequency and power sufficient to form a plasma within the apparatus for treating exhaust gas 104 such that the exhaust gas flowing through the apparatus for treating exhaust gas 104 may be treated with the plasma (e.g., at least partially broken down into one or more of ions, radicals, elements, smaller molecules, or the like). In some illustrative embodiments, the power source 110 may be a variable frequency power source capable of providing RF energy at a range of frequencies. In some illustrative embodiments, the power source 110 may provide about 2 to about 3 kW of RF energy at a frequency of about 1.9 to about 3.2 MHz.

Figure 2:
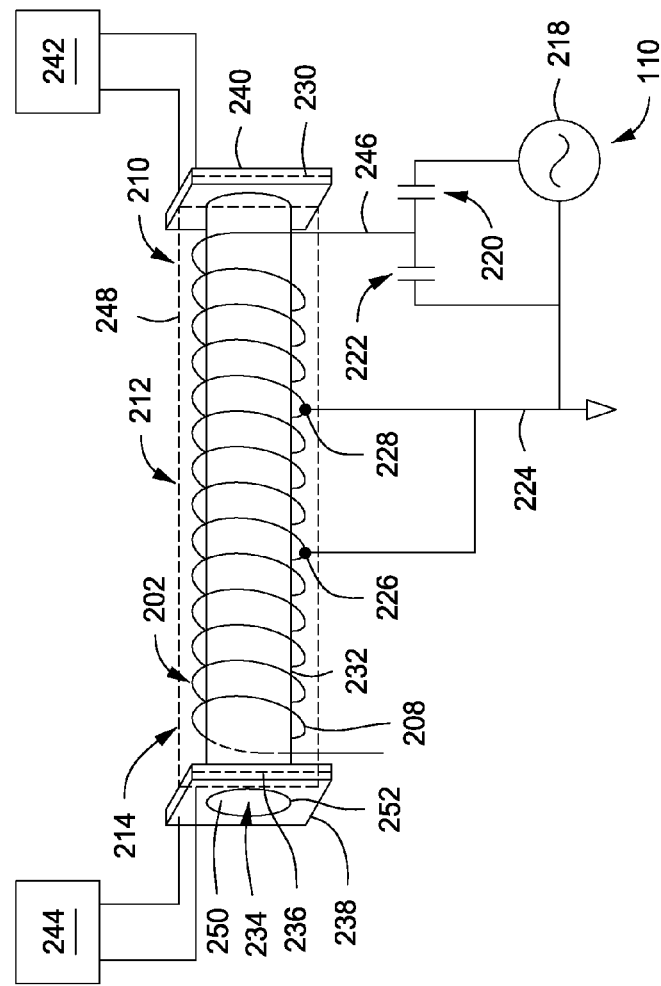
FIG. 2 is an apparatus for treating an exhaust gas in a foreline in accordance with some embodiments of the present invention.

Referring to FIG. 2, the apparatus for treating exhaust gas 104 may generally comprise a dielectric tube 202, an RF coil 208 wound about an outer surface 232 of the dielectric tube 202 and a tap 228 (e.g., a first tap) coupled to the RF coil 208. The dielectric tube 202 is configured to be installed in-line with the foreline 108. For example, in some embodiments, the apparatus for treating exhaust 104 may include a flange on either end of the apparatus for treating exhaust 104 to facilitate connection to the foreline 108, for example by bolting.

The dielectric tube 202 may be fabricated from any dielectric material suitable to allow the transmission of RF power to an inner volume 234 of the dielectric tube 202 to facilitate ignition of a plasma, for example, a ceramic such as alumina ($Al_2O_3$). In addition, the dielectric tube 202 may have any dimensions suitable to allow the flow of exhaust gases from a foreline and through the dielectric tube 202 for treatment. For example, in some embodiments, the dielectric tube 202 may have a length of about 6 to about 15 inches. In some embodiments, the dielectric tube 202 may have a diameter of about 1.5 to about 4 inches.

The dielectric tube 202 is configured to be disposed in line with a foreline of a process chamber (e.g. foreline 108 of process chamber 102 described above) such that exhaust gases from the foreline flow through the inner volume 234 of the dielectric tube 202. In some embodiments, the dielectric tube 202 may comprise a first outwardly extending flange 240 disposed on the first end 210 of the dielectric tube 202 and a second outwardly extending flange 238 disposed on the second end 214 of the dielectric tube 202 to facilitate coupling the dielectric tube 202 to the foreline 108. In some embodiments either or both of the first outwardly extending flange 240 and second outwardly extending flange 238 may comprise a plurality of channels 230, 236 configured to allow a flow of heat transfer fluid through either or both of the first outwardly extending flange 240 and second outwardly extending flange 238 to facilitate control of the temperature of the dielectric tube 202. In such embodiments, a heat transfer fluid supply or recirculator 242, 244 may be coupled to the plurality of channels 230 and/or 236. In some embodiments, an o-ring 252 may be disposed on one or both ends of the dielectric tube 202 to facilitate a forming a seal with the foreline 108.

The RF coil 208 is wound about an outer surface 232 of the dielectric tube 202 and extends from a first end 210 of the dielectric tube 202 to a second end 214 of the dielectric tube 202. The RF coil 208 may be wound about the outer surface of the dielectric tube 202 any number of times sufficient to provide uniform RF energy having a desired density to the inner volume 234 of the dielectric tube 202 to facilitate ignition of the exhaust gases within the dielectric tube 202 to form a plasma. For example, in some embodiments, the RF coil may have about 5 to about 15 turns. In some embodiments, each turn may be disposed about 0.25 to about 0.75 inches away from an adjacent turn. In some embodiments, a covering (shown in phantom at 248) may be disposed about the RF coil 208 to prevent direct contact between an operator and the RF coils 208.

The inventors have observed that exhaust treatment systems that utilize an RF power source coupled to a central portion of an RF coil to facilitate ignition of a plasma within the dielectric tube. For example, a conventional exhaust treatment system may include an RF coil wound about a tube, wherein RF energy is provided only between the center turns of a coil and not proximate the ends of the coils. The inventors have observed that in such systems, the center turns carry the RF current to inductively couple the RF energy to the inner volume to form the plasma. As a result, the RF current produces a magnetic field (B-field) about the central portion of the RF coil. Such a magnetic field prevents adjacent turns (e.g., an upper number of turns of the coil) from providing inductively coupled power, because such an inductively coupled power would cause an oppositely oriented magnetic field.

Moreover, the inventors have observed that conductive end plates disposed proximate ends of the act as parasitic capacitors, causing the powered-end of the coil (the RF input) to function as a high voltage capacitor to the plasma, thereby creating a high voltage floating coil section and a strong capacitively coupled discharge, thus undesirably causing a capacitively coupled region of the plasma to be formed within the dielectric tube. The inventors have observed that such a capacitively coupled region may undesirably cause the acceleration of ions contained within the plasma to be directed towards the inner walls of the tube, thereby causing erosion. For example, in instances where fluorine ($F_2$) is present in the plasma, fluorine ions may be directed towards an inner wall of the tube, thereby causing erosion. In some instances, for example where the tube is fabricated from aluminum oxide ($Al_2O_3$), the aluminum and fluorine ($F_2$) may combine to form aluminum fluoride ($AlF_x$) and be redeposited within the tube.

Accordingly, in some embodiments, the power source 110 (e.g., an RF power source 218) may be coupled to a first end 246 of the RF coil 208 disposed proximate the first end 210 of the dielectric tube 202. In such embodiments, the tap 228 may be coupled to the RF coil 208 and disposed between the first end 210 of the dielectric tube and a central portion 212 of the dielectric tube 202 to provide a return path for the RF power. By coupling the RF power source 218 to the first end 246 of the RF coil 208 and the tap 228, the above described high voltage floating coil section and associated capacitively coupled plasma region may be eliminated, thereby reducing or eliminating instances of ions directed towards inner walls 250 of the dielectric tube 202, thus reducing, decelerating or eliminating erosion of the dielectric tube 202. The tap 228 may be coupled to the RF coil 208 at any turn along the RF coil 208 between the first end 210 of the dielectric tube and a central portion 212 of the dielectric tube 202, for example, such as within a first five turns of the RF coil 208 from the first end of the dielectric tube 202.

In some embodiments, a second tap 226 may be coupled to the RF return path 224 and disposed closer to the second end 214 of the dielectric tube 202 than tap 228. The second tap 226 is located at a different location than the tap 228 and provides flexibility to couple RF energy through a different number of turns of the RF coil 208, for example, for different applications having different plasma requirements. In some embodiments, additional taps may be provided at different locations along the RF coil 208 to provide further flexibility in configuring the RF path along the RF coil 208 as desired.

In some embodiments, the second tap 226 may be disposed between the second end 214 of the dielectric tube 202 and tap 228.

In some embodiments, one or more capacitors may be coupled to the RF power source 218. For example, in some embodiments, a first capacitor 220 may be coupled to the RF power source 218 and disposed between the RF power source 218 and the RF coil 208. The first capacitor 220 may have a capacitance of about 500 to about 5000 picofarads (pF), or in some embodiments about 3000 picofarads (pF). Alternatively, or in combination, in some embodiments, a second capacitor 222 may be coupled to the RF power source 218 and disposed between the RF power source 218 and the RF return path 224. The second capacitor 222 may have a capacitance of about 500 to about 5000 picofarads (pF), or in some embodiments, about 2000 picofarads (pF). The first and second capacitors 220, 222 make the load resonant with the variable frequency power supply (e.g., the power source 110).

In operation, effluent from the process chamber 102 may be pumped through the foreline 108 and pass through the apparatus for treating exhaust gas 104. RF energy may be provided by the power source 110 to the RF coil to form an inductive plasma within the apparatus for treating exhaust gas 104. The configuration of the apparatus for treating exhaust gas 104 advantageously may provide a longer service life as compared to conventional apparatus having capacitively coupled regions of plasma formation within the plasma treatment apparatus.

While the foregoing is directed to embodiments of the present invention, other and further embodiments of the invention may be devised without departing from the basic scope thereof.

The invention claimed is:

1. An apparatus for treating an exhaust gas in a foreline of a substrate processing system, comprising:
    a dielectric tube configured to be coupled to the foreline of the substrate processing system to allow a flow of exhaust gases from the foreline through the dielectric tube;
    an RF coil wound about an outer surface of the dielectric tube, the RF coil having a first end to provide an RF input to the RF coil, the first end of the RF coil disposed proximate a first end of the dielectric tube and a second end disposed proximate a second end of the dielectric tube; and
    a tap coupled to the RF coil to provide an RF return path, the tap disposed between the first end of the dielectric tube and a central portion of the dielectric tube.

2. The apparatus of claim 1, further comprising:
    an RF power source coupled to a first end of the RF coil to provide RF power to the RF coil.

3. The apparatus of claim 2, further comprising:
    a first capacitor coupled to the RF power source and disposed between the RF power source and the first end of the RF coil.

4. The apparatus of claim 2, further comprising:
    a second capacitor coupled to the RF power source and disposed between the RF power source and the RF return path.

5. The apparatus of claim 1, wherein the dielectric tube is fabricated from alumina.

6. The apparatus of claim 1, wherein the tap is coupled to the RF coil within about five turns of the first end of the RF coil.

7. The apparatus of claim 1, wherein the dielectric tube comprises:
    a first outwardly extending flange disposed on the first end of the dielectric tube; and
    a second outwardly extending flange disposed on the second end of the dielectric tube, wherein each of the first outwardly extending flange and second outwardly extending flange couple the dielectric tube to the foreline.

8. The apparatus of claim 7, wherein each of the first outwardly extending flange and second outwardly extending flange comprise a plurality of channels to allow a flow of heat transfer fluid through each of the first outwardly extending flange and second outwardly extending flange.

9. The apparatus of claim 1, wherein the dielectric tube has a length of about 6 to about 15 inches.

10. The apparatus of claim 1, wherein the RF coil has a length of about 5 to about 15 turns.

11. The apparatus of claim 1, wherein the RF coil has a diameter of about 1.5 to about 4 inches.

12. The apparatus of claim 1, wherein a distance between turns of the RF coil is about 0.25 to about 0.75 inches.

13. The apparatus of claim 1, further comprising:
    a second tap coupled to a different position on the RF coil than the tap, wherein the second tap is disposed between the second end of the dielectric tube and the tap.

* * * * *